United States Patent
Ichikawa

(10) Patent No.: US 11,244,836 B2
(45) Date of Patent: Feb. 8, 2022

(54) SEMICONDUCTOR APPARATUS, POWER CONVERSION DEVICE, AND METHOD FOR MANUFACTURING SEMICONDUCTOR APPARATUS

(71) Applicant: Mitsubishi Electric Corporation, Tokyo (JP)

(72) Inventor: Keitaro Ichikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/491,276

(22) PCT Filed: Jun. 21, 2017

(86) PCT No.: PCT/JP2017/022870
§ 371 (c)(1),
(2) Date: Sep. 5, 2019

(87) PCT Pub. No.: WO2018/235197
PCT Pub. Date: Dec. 27, 2018

(65) Prior Publication Data
US 2020/0303215 A1    Sep. 24, 2020

(51) Int. Cl.
H01L 21/56 (2006.01)
H01L 23/29 (2006.01)
H01L 23/50 (2006.01)

(52) U.S. Cl.
CPC ............ *H01L 21/565* (2013.01); *H01L 23/29* (2013.01); *H01L 23/50* (2013.01)

(58) Field of Classification Search
None
See application file for complete search history.

(56) References Cited

U.S. PATENT DOCUMENTS

| | | |
|---|---|---|
| 5,184,285 A | 2/1993 | Murphy et al. |
| 5,666,003 A | 9/1997 | Shibata et al. |

(Continued)

FOREIGN PATENT DOCUMENTS

| | | |
|---|---|---|
| JP | H01-196153 A | 8/1989 |
| JP | H09-45821 A | 2/1997 |

(Continued)

OTHER PUBLICATIONS

An Office Action; "Notice of Reasons for Refusal," mailed by the Japanese Patent Office dated May 26, 2020, which corresponds to Japanese Patent Application No. 2019-524777 and is related to U.S. Appl. No. 16/491,276 with English language translation.

(Continued)

*Primary Examiner* — Khaja Ahmad
(74) *Attorney, Agent, or Firm* — Studebaker & Brackett PC

(57) ABSTRACT

A semiconductor apparatus according to the invention of the present application includes a base plate, a lead frame having a first surface and a second surface being a surface opposite to the first surface, the second surface being bonded to an upper surface of the base plate, a semiconductor device provided on the first surface of the lead frame, and a mold resin covering the upper surface of the base plate, the lead frame, and the semiconductor device, wherein the mold resin is provided with a terminal insertion hole that extends from the surface of the mold resin to the lead frame and in which a press-fit terminal is inserted, and the lead frame is provided with an opening portion which intercommunicates with the terminal insertion hole and into which the press-fit terminal is press-fitted.

20 Claims, 4 Drawing Sheets

(56) References Cited

U.S. PATENT DOCUMENTS

| | | | | |
|---|---|---|---|---|
| 2010/0007026 A1* | 1/2010 | Shikano | ................. | H01L 24/49 |
| | | | | 257/773 |
| 2010/0013086 A1* | 1/2010 | Obiraki | ................. | H01L 24/36 |
| | | | | 257/693 |
| 2010/0226095 A1* | 9/2010 | Mimura | ............. | H01L 23/3737 |
| | | | | 361/707 |
| 2012/0098138 A1* | 4/2012 | Oka | ................ | H01L 23/49811 |
| | | | | 257/773 |
| 2015/0380274 A1* | 12/2015 | Yoshimatsu | ........ | H01L 23/3121 |
| | | | | 438/126 |
| 2016/0155706 A1 | 6/2016 | Yoneyama et al. | | |

FOREIGN PATENT DOCUMENTS

| | | | | | | |
|---|---|---|---|---|---|---|
| JP | 2010-027813 A | | 2/2010 | | | |
| JP | 2013-152966 A | | 8/2013 | | | |
| JP | 2013152966 A | * | 8/2013 | ............. | H01L 24/40 |
| JP | 2016-103941 A | | 6/2016 | | | |

OTHER PUBLICATIONS

International Search Report; Written Opinion; and Notification of Transmittal of The International Search Report and the Written Opinion of the International Searching Authority, or the Declaration issued in PCT/JP2017/022870; dated Aug. 22, 2017.

* cited by examiner

SEMICONDUCTOR APPARATUS, POWER CONVERSION DEVICE, AND METHOD FOR MANUFACTURING SEMICONDUCTOR APPARATUS

FIELD

The present invention relates to a semiconductor apparatus, a power conversion device and a method for manufacturing a semiconductor apparatus.

BACKGROUND

PTL 1 discloses a semiconductor apparatus for power that is provided with a semiconductor device for power and a lead pattern. The lead pattern is electrically connected to the semiconductor device on one end side of the lead pattern. Furthermore, the lead pattern has a through-hole on the other end side thereof. The semiconductor device for power and the lead pattern are sealed by a sealing body. In the sealing body is formed a female connector which intercommunicates with the through-hole and inserts a press-fit terminal.

PTL 2 discloses a semiconductor apparatus for power in which a wiring pattern and a semiconductor device for power bonded to the wiring pattern are sealed with a transfer mold resin. The semiconductor apparatus for power is provided with a cylindrical external terminal intercommunication portion which is connected to an external terminal by inserting the external terminal into the cylindrical external terminal intercommunication portion. The cylindrical external terminal intercommunication portion is placed to be substantially perpendicular to the wiring pattern.

CITATION LIST

Patent Literature

[PTL 1] JP 2013-152966 A
[PTL 2] JP 2010-27813 A

SUMMARY

Technical Problem

Industrial semiconductor apparatuses for power may be required to be connected to external devices by press-fitting particularly in such a case that sales thereof are expanded to Europe. Case type modules are known as semiconductor apparatuses for power to which press-fitting is applied. In general, the case type module is configured by a semiconductor device, a base plate, an insulating substrate, a case, resin, etc. The package size of the case type module may increase because of use of a case. Therefore, the manufacturing cost may increase. Moreover, the case type module may have a structure in which it is impossible to remove a press-fit terminal from the case.

In the semiconductor apparatus for power disclosed in PTL 1, the lead pattern is mounted on the semiconductor device for power. For this reason, the distance in the height direction between the lead pattern and a heat sink increases. Therefore, when the press-fit terminal is inserted into the through-hole, damage such as a crack may occur in the sealing body or the semiconductor device for power.

In the semiconductor apparatus for power disclosed in PTL 2, in order to form the cylindrical external terminal intercommunication portion, it is necessary to newly add a component. Therefore, the semiconductor apparatus for power may increase in size.

The present invention has been made to solve the above-described problems, and has an object to obtain a semiconductor apparatus, a power conversion device, and a method for manufacturing a semiconductor apparatus that are capable of enhancing the reliability.

Solution to Problem

A semiconductor apparatus according to the present invention includes a base plate, a lead frame having a first surface and a second surface that is a surface opposite to the first surface, the second surface being bonded to an upper surface of the base plate, a semiconductor device provided on the first surface of the lead frame and a mold resin that covers the upper surface of the base plate, the lead frame, and the semiconductor device, wherein the mold resin is provided with a terminal insertion hole which extends from a surface of the mold resin to the lead frame and into which a press-fit terminal is inserted, and the lead frame is provided with an opening portion which intercommunicates with the terminal insertion hole and into which the press fit terminal is press-fitted.

A method for manufacturing a semiconductor apparatus includes a step of providing a lead frame having a first surface and a second surface being a surface opposite to the first surface with an opening portion in which a press-fit terminal is press-fitted, a step of providing a semiconductor device on the first surface, a step of bonding the second surface onto an upper surface of a base plate and a molding step of forming a mold resin that covers the upper surface of the base plate, the lead frame, and the semiconductor device, wherein in the molding step, a terminal insertion hole which intercommunicates with the opening portion from a surface of the mold resin and into which the press-fit terminal is inserted is formed in the mold resin.

Advantageous Effects of Invention

In the semiconductor apparatus according to the invention of the present application, the lead frame is bonded to the base plate. Therefore, as compared with a structure in which the lead frame is bonded onto the semiconductor device, occurrence of damage in the mold resin or the semiconductor device can be suppressed when the press-fit terminal is inserted into the opening portion.

In the method for manufacturing a semiconductor apparatus according to the invention of the present application, the lead frame is bonded to the base plate. Therefore, as compared with a structure in which the lead frame is bonded onto the semiconductor device, occurrence of damage in the mold resin or the semiconductor device can be suppressed when the press-fit terminal is inserted into the opening portion.

DESCRIPTION OF EMBODIMENTS

A semiconductor apparatus, a power conversion device, and a method for manufacturing a semiconductor apparatus according to embodiments of the present invention will be described with reference to the drawings. The same or corresponding components may be represented by the same reference signs, and duplicative description thereof may be omitted.

First Embodiment

Figure 1:
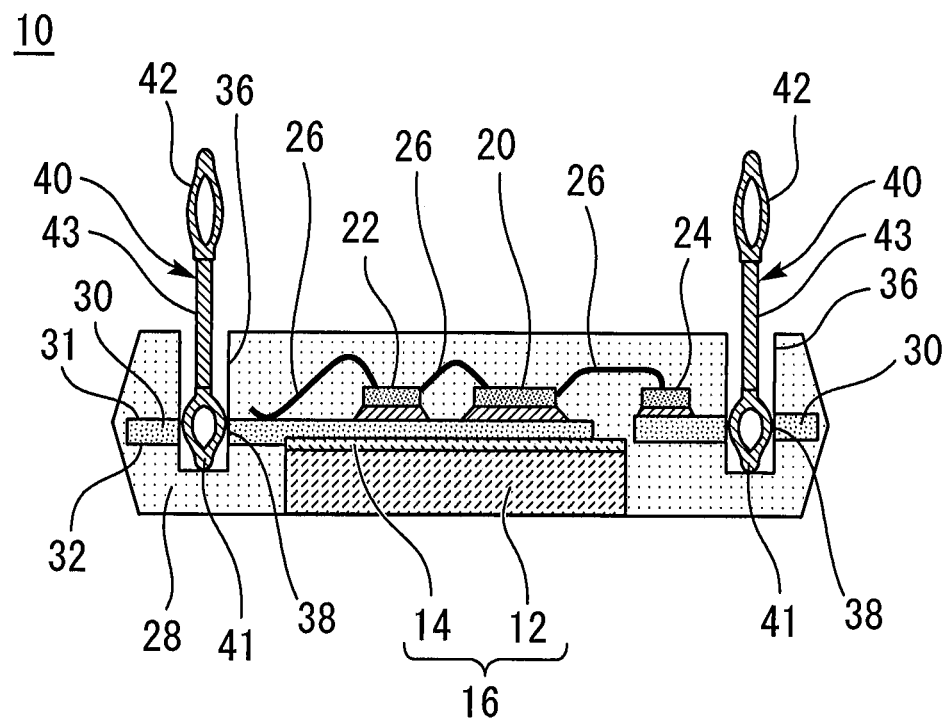
FIG. 1 is a cross-sectional view of a semiconductor apparatus according to a first embodiment.

FIG. 1 is a cross-sectional view of a semiconductor apparatus 10 according to a first embodiment. The semiconductor apparatus 10 is a semiconductor apparatus for power. The semiconductor apparatus 10 includes a conductive plate 12. The conductive plate 12 is formed of copper, aluminum or the like. An insulating layer 14 is provided on the upper surface of the conductive plate 12. The insulating layer 14 is bonded onto the upper surface of the conductive plate 12. The insulating layer 14 has high thermal conductivity. The insulating layer 14 is formed of, for example, an epoxy resin containing a high conductivity filler. The conductive plate 12 and the insulating layer 14 constitute a base plate 16. The configuration of the base plate 16 is not limited to the above configuration. The base plate 16 may be a heat sink.

A lead frame 30 is provided on the insulating layer 14. The lead frame 30 has a first surface 31 and a second surface 32 which is a surface opposite to the first surface 31. The second surface 32 of the lead frame 30 is bonded to the upper surface of the base plate 16. The second surface 32 is bonded to the insulating layer 14. The lead frame 30 is formed of a copper material. The lead frame 30 is not limited to the copper material, and may be formed of a material having a necessary heat dissipation characteristic.

Plural semiconductor devices 20, 22, and 24 are provided on the first surface 31 of the lead frame 30. Each of the plural semiconductor devices 20, 22, and 24 is bonded to the first surface 31. Each of the semiconductor devices 20, 22, and 24 is, for example, a semiconductor device for power. The semiconductor device for power is, for example, IGBT (Insulated Gate Bipolar Transistor), MOSFET (Metal-Oxide-Semiconductor Field-Effect Transistor), or a diode.

The base plate 16 is provided to a lower portion of a portion of the lead frame 30 to which the semiconductor device 20 and the semiconductor device 22 are bonded. On the other hand, the base plate 16 is not provided to a lower portion of a portion of the lead frame 30 to which the semiconductor device 24 is bonded. In cross-sectional view, the portion of the lead frame 30 where the semiconductor devices 20 and 22 are provided and the portion of the lead frame 30 where the semiconductor device 24 is provided are separated from each other.

The plural semiconductor devices 20, 22, and 24 are connected to one another by plural wires 26. The semiconductor device 22 and the lead frame 30 are connected to each other by a wire 26. Each of the plural wires 26 is a thin metal wire. The material of each wire 26 is, for example, aluminum or gold. The material of each wire 26 may be a material other than this.

The semiconductor apparatus 10 is sealed with a mold resin 28. The mold resin 28 covers the upper surface of the base plate 16, the lead frame 30, the plural semiconductor devices 20, 22, and 24 and the plural wires 26. The lead frame 30 is covered with the mold resin 28 up to the end portion of the lead frame 30. Furthermore, the mold resin 28 covers the insulating layer 14 and the side surface of the conductive plate 12. The back surface of the conductive plate 12 and the back surface of the mold resin 28 form a flat surface serving as the back surface of a package. The upper surface of the mold resin 28 faces the first surface 31 and is provided in parallel with the first surface 31. The back surface of the mold resin 28 faces the second surface 32 and is provided in parallel with the second surface 32.

The mold resin 28 is a transfer mold resin. The semiconductor apparatus 10 of the present embodiment includes a transfer mold type package. The mold resin 28 is formed of a material including a thermosetting resin material. Since the mold resin 28 is formed by a transfer mold method, it is formed of a material having fluidity when resin sealing is performed.

The mold resin 28 is provided with terminal insertion holes 36 into which press-fit terminals 40 are inserted. The terminal insertion holes 36 extend from a surface facing the first surface 31 of the mold resin 28 to the first surface 31. The surface facing the first surface 31 of the mold resin 28 is the upper surface of the mold resin 28. The lead frame 30 is provided with an opening portion 38 into which the press-fit terminal 40 is press-fitted. The opening portion 38 intercommunicates with the terminal insertion hole 36. The press-fit terminal 40 is press-fitted into the opening portion 38 from the first surface 31 side. The opening portion 38 penetrates from the first surface 31 to the second surface 32.

The terminal insertion hole 36 extends from the upper surface of the mold resin 28 to the lower side of the lead frame 30 so as to sandwich the opening portion 38. The terminal insertion hole 36 extends perpendicularly to the first surface 31. The terminal insertion hole 36 extends to a position where the lower end of the press-fit terminal 40 is provided in a state where the press-fit terminal 40 is inserted in the terminal insertion hole 36. The terminal insertion hole 36 has a width which allows the press-fit terminal 40 to be inserted into the terminal insertion hole 36. The opening portion 38 has a width which allows the press-fit terminal 40 to be press-fitted into the opening portion 38.

A first press-fit portion 41 and a second press-fit portion 42 are each provided at both ends of the press-fit terminal 40. Each of the first press-fit portion 41 and the second press-fit portion 42 has an elastic force. The first press-fit portion 41 and the second press-fit portion 42 are connected to each other by a linearly extending connection portion 43. The first press-fit portion 41 is press-fitted into the opening portion 38.

The press-fit terminal 40 inserted in the terminal insertion hole 36 extends along the terminal insertion hole 36. The upper end of the press-fit terminal 40 protrudes from the mold resin 28. The second press-fit portion 42 is provided outside the mold resin 28. The second press-fit portion 42 is press-fitted in an external device.

The press-fit terminal 40 is a terminal for external connection. The first press-fit portion 41 and the second press-fit portion 42 which are provided at both ends of the press-fit terminal 40 each have a spring property. The semiconductor apparatus 10 and the external device are connected to each other by inserting the press-fit terminal 40 into the external device provided on the upper surface side of the mold resin 28. When the semiconductor apparatus 10 and the external device are connected to each other, soldering is not performed.

In the present embodiment, the semiconductor apparatus 10 includes plural press-fit terminals 40. In addition, the mold resin 28 is also provided with plural terminal insertion holes 36 which each correspond to the plural press-fit terminals 40. Similarly, the lead frame 30 is provided with plural opening portions 38 which each correspond to the plural press-fit terminals 40. The number and arrangement of the plural press-fit terminals 40 are adjusted in accordance with the arrangement of terminals of the external device to which the semiconductor apparatus 10 is connected.

Figure 2:
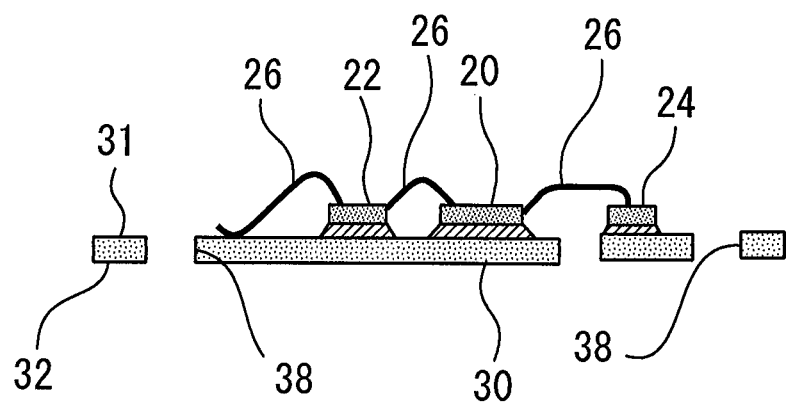
FIG. 2 is a cross-sectional view showing a state where the plural opening portions are formed in the lead frame.

Next, a method of producing the semiconductor apparatus 10 will be described. First, the lead frame 30 is provided with the plural opening portions 38. FIG. 2 is a cross-sectional view showing a state where the plural opening portions 38 are formed in the lead frame 30. Next, the plural semiconductor devices 20, 22, and 24 are provided on the first surface 31. The plural semiconductor devices 20, 22, and 24 are bonded to the first surface 31. Next, the plural semiconductor devices 20, 22, 24 are wired to one another and the semiconductor device 22 and the lead frame 30 are wired to each other by the plural wires 26.

Next, the second surface 32 is bonded to the upper surface of the base plate 16. Here, after the lead frame 30 and the base plate 16 are bonded to each other, the plural semiconductor devices 20, 22, and 24 may be bonded to the lead frame 30. After the lead frame 30 and the base plate 16 are bonded to each other, wiring by the plural wires 26 may be performed.

Figure 3:
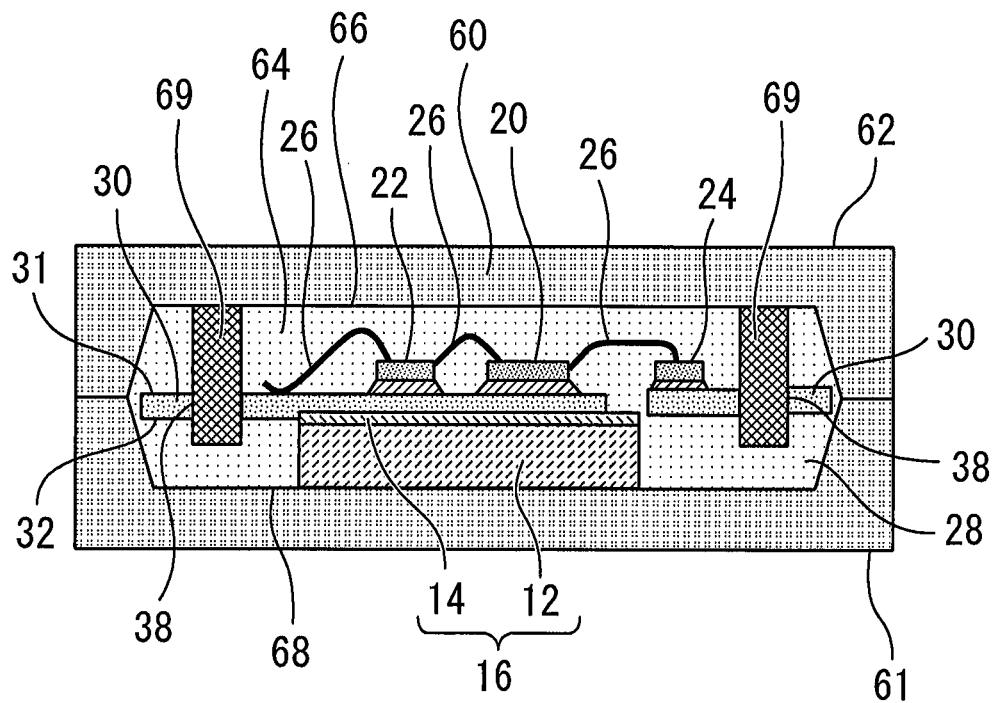
FIG. 3 is a cross-sectional view showing the molding process.

Next, a molding process is performed. FIG. 3 is a cross-sectional view showing the molding process. In the molding process, mold resin 28 is formed. First, a mold 60 is prepared. The mold 60 includes an upper mold 62 and a lower mold 61. By combining the upper mold 62 and the lower mold 61, a cavity 64 is formed inside the mold 60.

The upper mold 62 has plural pins 69 extending from a ceiling portion 66 of the cavity 64 to a bottom surface 68 of the cavity 64. The plural pins 69 are provided at positions each corresponding to the plural opening portions 38.

Next, the base plate 16, the lead frame 30, the plural semiconductor devices 20, 22, and 24 and the plural wires 26 are accommodated in the cavity 64. At this time, the plural pins 69 are each inserted into the plural opening portions 38. Next, the mold resin 28 is injected into the cavity 64 in a state where the plural pins 69 are each inserted in the plural opening portions 38. As a result, the mold resin 28 is molded.

Figure 4:
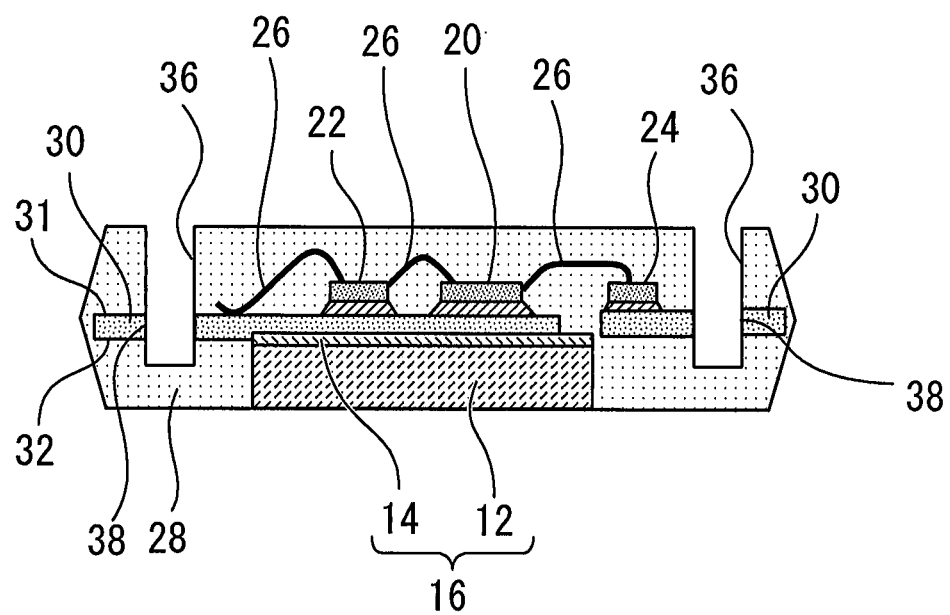
FIG. 4 is a cross-sectional view showing a state where the mold resin has been molded.

FIG. 4 is a cross-sectional view showing a state where the mold resin 28 has been molded. The plural terminal insertion holes 36 are formed in the mold resin 28 by the molding process. The plural terminal insertion holes 36 each intercommunicate with the plural opening portions 38 from the surface of the mold resin 28. By providing the terminal insertion holes 36 in the mold resin 28, the plural press-fit terminals 40 can be inserted into the plural opening portions 38 of the lead frame 30. A method of molding the mold resin 28 by using the mold 60 is an example of the molding process. In the molding process, another method may be used as long as the terminal insertion hole 36 can be formed.

The semiconductor apparatus 10 according to the present embodiment includes a transfer mold type package. Therefore, the package can be miniaturized as compared with the case type package. In general, transfer mold type packages can be mass-produced. For this reason, the manufacturing cost can be reduced as compared with the case type package.

It is unnecessary for the semiconductor apparatus 10 to newly add a component such as a cylindrical external terminal intercommunication portion for connection with an external device. In the present embodiment, connection with an external device is possible by providing the plural opening portions 38 in the lead frame 30 and providing the plural terminal insertion holes 36 in the mold resin 28. Accordingly, the cost of the components of the semiconductor apparatus 10 can be reduced. Furthermore, the structure of the semiconductor apparatus 10 can be simplified, and further cost reduction can be realized.

In the semiconductor apparatus 10, the plural press-fit terminals 40 can be connected to the semiconductor apparatus 10 by inserting the plural press-fit terminals 40 from the upper surface side of the mold resin 28. Therefore, as compared with a case where a terminal for external connection is bonded to the semiconductor apparatus by solder or the like, it is easy to insert and take out the plural press-fit terminals 40. Accordingly, the semiconductor apparatus 10 can be easily applied to various types of products.

In the present embodiment, the plural press-fit terminals 40 are inserted into the lead frame 30. Therefore, as compared with a case where the press-fit terminals are brought into direct contact with the semiconductor device, it is possible to prevent the semiconductor devices 20, 22, and 24 from being damaged due to the press-fitting of the plural press-fit terminals 40. Accordingly, reliability of the semiconductor apparatus 10 can be enhanced.

In the semiconductor apparatus 10 according to the present embodiment, the lead frame 30 is bonded to the base plate 16. In the present embodiment, the distance in the height direction between the lead frame 30 and the base plate 16 is shorter as compared with a structure in which the lead frame is bonded onto the semiconductor device. The lead frame 30 is supported by the base plate 16, which makes it difficult to apply stress to the mold resin 28 or the plural semiconductor devices 20, 22, and 24 when the plural press-fit terminals 40 are each inserted into the plural opening portions 38. Therefore, it can be suppressed that damage such as a crack occurs in the mold resin 28 or the plural semiconductor devices 20, 22, and 24. Accordingly, the reliability of the semiconductor apparatus 10 can be further enhanced.

In the present embodiment, the plural semiconductor devices 20, 22, and 24 are provided on the first surface 31 of the lead frame 30. The plural press-fit terminals 40 are press-fitted into the opening portions 38 from the first surface 31 side. In other words, the plural semiconductor devices 20, 22, and 24 are provided on the surface of the lead frame 30 into which the plural press-fit terminals 40 are press-fitted. Therefore, when the plural press-fit terminals 40 are each press-fitted into the plural opening portions 38, it is possible to suppress the stress that the plural semiconductor devices 20, 22, and 24 suffer from the lead frame 30. Accordingly, the stress suffered by the plural semiconductor devices 20, 22, and 24 can be further reduced, and the reliability of the semiconductor apparatus 10 can be further enhanced.

In the present embodiment, the back surfaces of the plural semiconductor devices 20, 22, and 24 are bonded to the lead frame 30. The upper surface of each of the plural semiconductor devices 20, 22, and 24 is connected to another semiconductor device or lead frame 30 by a wire 26. Therefore, it is unnecessary to provide a circuit board or a circuit pattern on the base plate 16. Accordingly, the number of components can be reduced as compared with a configuration in which the back surface of the semiconductor device and the circuit board are connected to each other and the lead frame is connected to the upper surface of the semiconductor device.

The lead frame 30 is accommodated inside the package. In other words, the end portion of the lead frame 30 is covered with the mold resin 28, and is not exposed from the side surface of the mold resin 28. Here, the side surface of the mold resin 28 is a surface between the upper surface and the back surface of the mold resin 28. Therefore, the creepage distance between the plural press-fit terminals 40 increases as compared with a configuration in which the lead frame is exposed from the side surface of the mold resin. Therefore, the withstand voltage can be enhanced.

The structure of the semiconductor apparatus 10 shown in FIG. 1 is an example, and the present embodiment can also be applied to a package having another structure as long as it is a transfer mold type package. In the present embodiment, the semiconductor apparatus 10 includes the plural semiconductor devices 20, 22, and 24, but the semiconductor apparatus 10 may include one or more semiconductor devices. Furthermore, the semiconductor apparatus 10 may include a circuit component in addition to the three semiconductor devices 20, 22, and 24.

The structure of the lead frame 30 is not limited to that shown in FIG. 1, and may be another structure as long as it is bonded to the base plate 16. When the lead frame 30 is separated into plural portions as shown in FIG. 1, one or more opening portions 38 may be provided to a portion of the lead frame 30 at which the portion is bonded to the base plate 16.

In the present embodiment, the plural terminal insertion holes 36 are provided on the upper surface of the mold resin 28. As a modification, the plural terminal insertion holes 36 may extend from the surface of the mold resin 28 to the lead frame 30. Each of the terminal insertion holes 36 may be provided at a location other than the upper surface as long as each of the terminal insertion holes 36 intercommunicates with the opening portion 38 and the press-fit terminal 40 can be inserted therein.

For example, the plural terminal insertion holes 36 may extend from the back-surface side of the mold resin 28 to the lead frame 30. In this case, the plural press-fit terminals 40 are press-fitted into the lead frame 30 from the second surface 32 side. Some terminal insertion holes 36 out of the plural terminal insertion holes 36 may be provided on the upper surface of the mold resin 28, and the other terminal insertion holes 36 may be provided on the back surface of the mold resin 28.

As another modification of the present embodiment, the semiconductor apparatus 10 may not include the plural press-fit terminals 40. The semiconductor apparatus 10 is provided in either a state shown in FIG. 1 where the plural press-fit terminals 40 are inserted or a state shown in FIG. 4 where the plural press-fit terminals 40 are not inserted. In other words, in the semiconductor apparatus 10, the presence or absence of the plural press-fit terminals 40 can be optionally selected. According to the present modification, the semiconductor apparatus 10 can be applied, for example, in such a case that the external device is provided with plural press-fit terminals in advance. Accordingly, the semiconductor apparatus 10 can be adapted to various applications.

As another modification of the present embodiment, one or more of the plural semiconductor devices 20, 22, 24 may be made with a wide band gap semiconductor. The wide band gap semiconductor is, for example, silicon carbide, gallium-nitride-based materials or diamond. By forming the plural semiconductor devices 20, 22, and 24 of wide band gap semiconductors, the plural semiconductor devices 20, 22, and 24 can be miniaturized. In addition, since the wide band gap semiconductor has high heat resistance, the heat sink can be miniaturized. Accordingly, the semiconductor apparatus 10 can be further miniaturized.

These modifications can be applied appropriately to the semiconductor apparatus, the power conversion device, and the method for manufacturing the semiconductor apparatus according to the following embodiments. Note that the semiconductor apparatus, the power conversion device, and the method for manufacturing the semiconductor apparatus according to the following embodiments have many common points with the first embodiment, and therefore, differences from the first embodiment will be mainly described.

Second Embodiment

Figure 5:
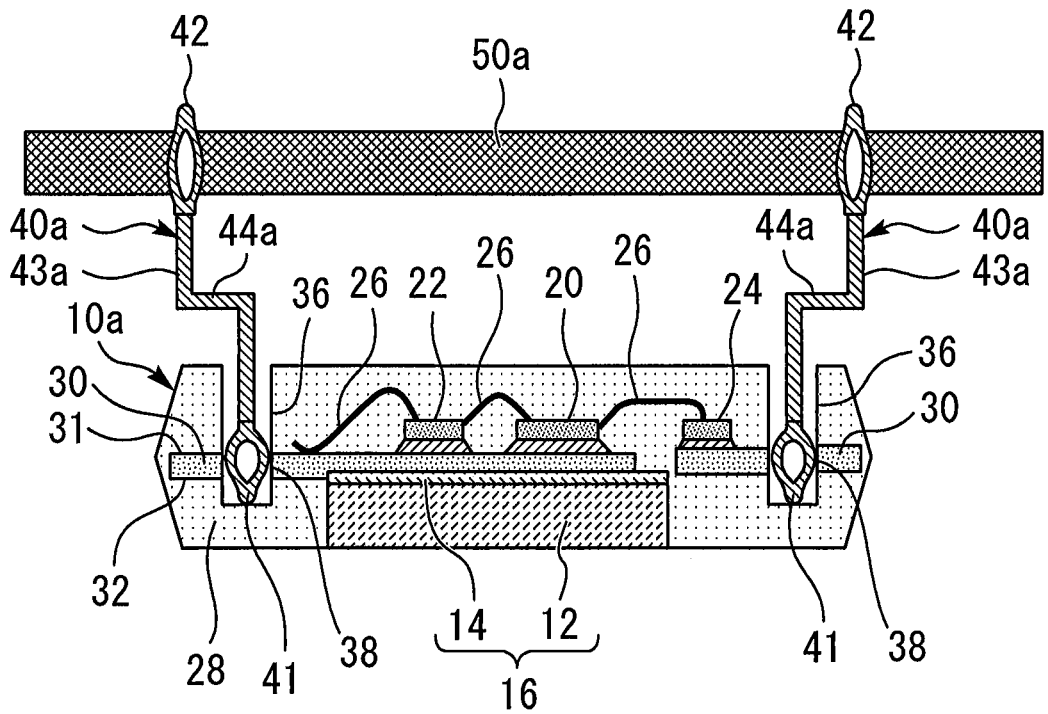
FIG. 5 is a cross-sectional view showing a state in which a semiconductor apparatus according to a second embodiment is connected to a mounting substrate.

FIG. 5 is a cross-sectional view showing a state in which a semiconductor apparatus 10a according to a second embodiment is connected to a mounting substrate 50a. The mounting substrate 50a is an external device. The semiconductor apparatus 10a differs from the first embodiment in the structure of plural press-fit terminals 40a. Each of the plural press-fit terminals 40a has a bending portion 44a between the first press-fit portion 41 and the second press-fit portion 42. The first press-fit portion 41 and the second press-fit portion 42 are connected to each other by a connection portion 43a.

The connection portion 43a extends perpendicularly to the first surface 31 from the first press-fit portion 41 to the upper surface of the mold resin 28. The connection portion 43a bends in a horizontal direction above the mold resin 28. Thereafter, the connection portion 43a is further bent in a vertical direction. From the foregoing, the bending portion 44a is formed in the press-fit terminal 40a. The connection portion 43a further vertically extends upward and is connected to the second press-fit portion 42.

The positions of the first press-fit portion 41 and the second press-fit portion 42 in the horizontal direction are displaced from each other by the bending portion 44a. Here, the horizontal direction is a direction parallel to the upper surface of the mold resin 28 or the first surface 31 of the lead frame 30. The vertical direction is a direction perpendicular to the upper surface of the mold resin 28 or the first surface 31 of the lead frame 30.

In the present embodiment, each of the plural press-fit terminals 40a is bent outward of the mold resin 28 in the horizontal direction. Therefore, the second press-fit portion 42 is provided outward in the horizontal direction with respect to the first press-fit portion 41. Accordingly, the distance between the second press-fit portions 42 of the plural press-fit terminals 40a is longer than that in the first embodiment.

In the present embodiment, even when the distance between terminals of the mounting substrate 50a to which the semiconductor apparatus 10a is connected is long, the semiconductor apparatus 10a can be connected to the mounting substrate 50a. Therefore, for example, the semiconductor apparatus 10a can be applied to a large-size mounting substrate 50a on the assumption that a case type semiconductor apparatus is connected. Even when the mounting substrate 50a is standardized, the semiconductor apparatus 10a can be connected to the mounting substrate 50a and used by adjusting the shape of the bending portion 44a. Accordingly, the semiconductor apparatus 10a according to the present embodiment can be provided to a customer for which the structure of the mounting substrate 50a is difficult to change.

The bending portion 44a is provided outside the mold resin 28. Therefore, the semiconductor apparatus 10a can be miniaturized as compared with a case where the bending portion is provided inside the mold resin.

In the present embodiment, the connection portion 43a is bent vertically at the bending portion 44a. As a modification, the connection portion 43a may not be bent vertically. Also, the connection portion 43a may be curved. Any shape can be adopted for the bending portion 44a as long as the positions of the first press-fit portion 41 and the second press-fit portion 42 in the horizontal direction can be displaced from each other.

Figure 6:
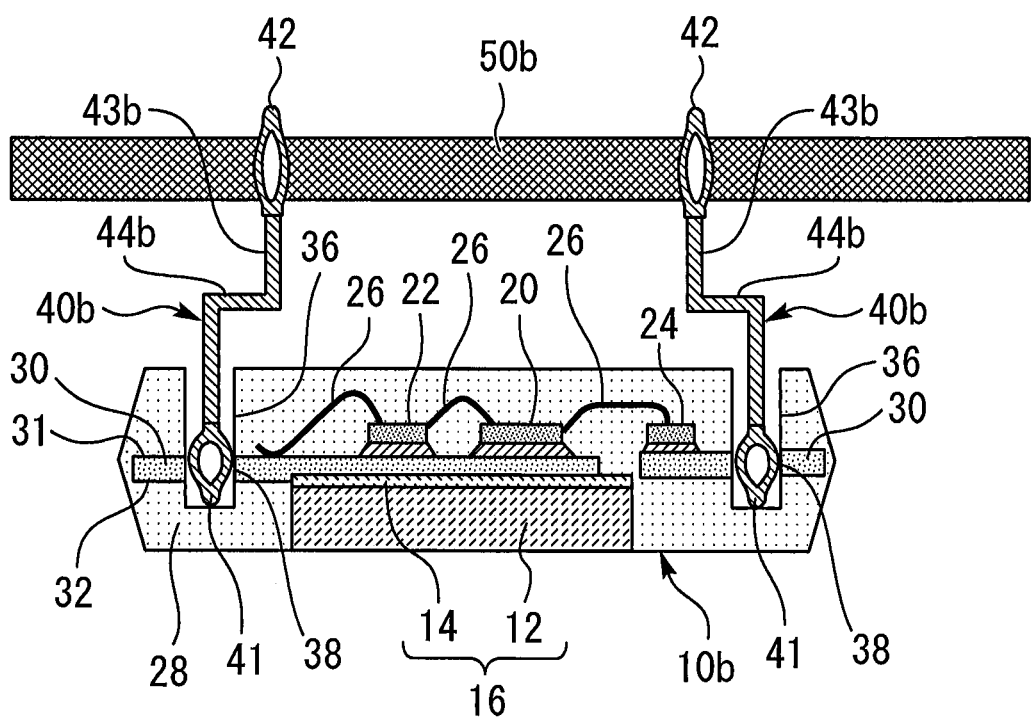
FIG. 6 is a cross-sectional view showing a state in which a semiconductor apparatus according to a modification of the second embodiment is connected to the mounting substrate.

FIG. 6 is a cross-sectional view showing a state in which a semiconductor apparatus 10b according to a modification of the second embodiment is connected to the mounting substrate 50b. The semiconductor apparatus 10b includes plural press-fit terminals 40b. Each of the plural press-fit terminals 40b has a bending portion 44b between the first press-fit portion 41 and the second press-fit portion 42. The first press-fit portion 41 and the second press-fit portion 42 are connected to each other by a connection portion 43b.

In the semiconductor apparatus 10b, the second press-fit portion 42 is provided inward in the horizontal direction with respect to the first press-fit portion 41. Accordingly, the distance between the second press-fit portions 42 of the plural press-fit terminals 40b is short as compared with the first embodiment.

In the present modification, even when the distance between terminals of the mounting substrate 50b to which the semiconductor apparatus 10b is connected is short, the semiconductor apparatus 10b can be connected to the mounting substrate 50b. Therefore, the semiconductor apparatus 10b can be applied to, for example, a compact-size mounting substrate 50b.

Third Embodiment

In the present embodiment, the semiconductor apparatuses 10, 10a, and 10b according to the first or second embodiment described above are applied to a power conversion device. Although the present embodiment is not limited to a specific power conversion device, a case where the semiconductor apparatuses 10, 10a and 10b are applied to a three-phase inverter will be hereinafter described as a third embodiment.

Figure 7:
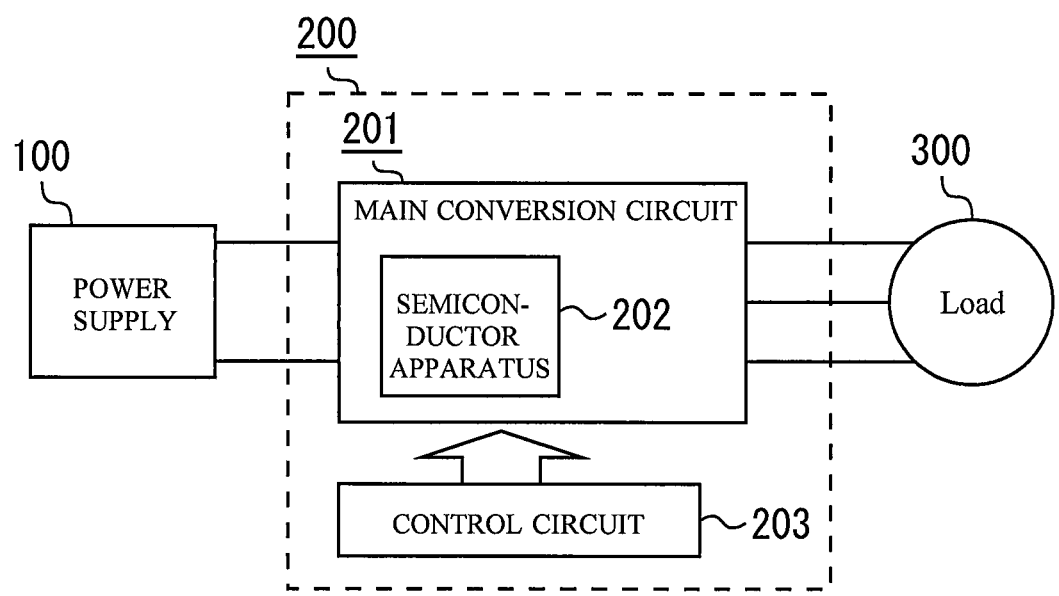
FIG. 7 is a block diagram showing a configuration of a power conversion system to which a power conversion device according to the third embodiment is applied.

FIG. 7 is a block diagram showing a configuration of a power conversion system to which a power conversion device 200 according to the third embodiment is applied. The power conversion system shown in FIG. 7 includes a power supply 100, the power conversion device 200, and a load 300.

The power supply 100 is a DC power supply, and supplies DC power to the power conversion device 200. The power supply 100 can be configured by various things, and can be configured by, for example, a DC system, a solar cell, or a storage battery. The power supply 100 may also be configured by a rectifier circuit or AC/DC converter which is connected to an AC system. Further, the power supply 100 may be configured by a DC/DC converter that converts DC power output from the DC system into predetermined power.

The power conversion device 200 is a three-phase inverter connected between the power supply 100 and the load 300.

The power conversion device 200 converts DC power supplied from the power supply 100 into AC power, and supplies the AC power to the load 300. As shown in FIG. 7, the power conversion device 200 includes a main conversion circuit 201 for converting DC power into AC power and outputting the AC power, and a control circuit 203 that outputs a control signal for controlling the main conversion circuit 201 to the main conversion circuit 201.

The load 300 is a three-phase electric motor driven with AC power supplied from the power conversion device 200. Note that the load 300 is not limited to a specific application, and is an electric motor mounted in various kinds of electric equipment. The load 300 is used, for example, as an electric motor for a hybrid car, an electric car, a rail car, an elevator or an air conditioner.

Hereinafter, the details of the power conversion device 200 will be described. The main conversion circuit 201 includes a switching device and a freewheeling diode (not shown). The main conversion circuit 201 converts DC power supplied from the power supply 100 into AC power and supplies the AC power to the load 300 by switching of the switching devices. There are various types of specific circuit configurations for the main conversion circuit 201, but the main conversion circuit 201 according to the present embodiment is a two-level three-phase full bridge circuit. The two-level three-phase full bridge circuit can be configured by six switching devices and six freewheeling diodes which are antiparallel to the respective switching devices.

The main conversion circuit 201 includes a semiconductor apparatus 202 corresponding to any of the semiconductor apparatuses 10, 10a and 10b described above. At least some of the respective switching devices and the respective freewheeling diodes of the main conversion circuit 201 are configured by any of the plural semiconductor devices 20, 22, and 24.

Every two switching devices of the six switching devices are connected in series to each other to configure an upper-and-lower arm. Respective upper and lower arms constitute respective phases of a full bridge circuit. The full bridge circuit has a U-phase, a V-phase, and a W-phase. The output terminals of the respective upper and lower arms, that is, the three output terminals of the main conversion circuit 201 are connected to the load 300.

The main conversion circuit 201 includes a drive circuit not shown for driving each switching device. The drive circuit may be incorporated in the semiconductor apparatus 202, or may be configured to be provided separately from the semiconductor apparatus 202. The drive circuit generates a drive signal for driving the switching device of the main conversion circuit 201 and supplies the drive signal to a control electrode of the switching device of the main conversion circuit 201. Specifically, in accordance with a control signal from the control circuit 203 described later, a drive signal for setting the switching device to ON-state and a drive signal for setting the switching device to OFF-state are output to the control electrode of each switching device. When the switching device is maintained in the ON-state, the drive signal is an ON signal which is a voltage signal equal to or higher than a threshold voltage of the switching device. When the switching device is maintained in the OFF-state, the drive signal is an OFF signal which is a voltage signal equal to or lower than the threshold voltage of the switching device.

The control circuit 203 controls the switching devices of the main conversion circuit 201 so that a desired power is supplied to the load 300. Specifically, based on the power to be supplied to the load 300, the control circuit 203 calculates an ON-time which is a period of time when each switching device of the main conversion circuit 201 should be set to ON-state. For example, the control circuit 203 can control the main conversion circuit 201 by PWM (Pulse Width Modulation) control for modulating the ON-time of the switching device according to the voltage to be output. A control command is output to the drive circuit included in the main conversion circuit 201 so that an ON signal is output to switching devices which should be set to the ON-state at each time point and an OFF signal is output to switching devices which should be set to the OFF-state at each time point. The control command corresponds to the control signal. The drive circuit outputs the ON signal or the OFF signal as a drive signal to the control electrode of each switching device in accordance with the control signal.

In power conversion device 200 according to the present embodiment, the main conversion circuit 201 includes the semiconductor apparatus 202 corresponding to any of the semiconductor apparatuses 10, 10a, and 10b described above. Therefore, miniaturization and cost reduction of the power conversion device 200 can be achieved. In addition, the reliability of the power conversion device 200 can be enhanced.

Although the example in which the semiconductor apparatus 202 is applied to the two-level three-phase inverter has been described in the present embodiment. However, the present invention is not limited to this example, and the semiconductor apparatus 202 can be applied to various power conversion devices. In the present embodiment, the power conversion device 200 is the two-level power conversion device, but it may be a three-level or multi-level power conversion device. Furthermore, when power is supplied to a single-phase load, the semiconductor apparatus 202 may be applied to a single-phase inverter. When power is supplied to a DC load or the like, the semiconductor apparatus 202 can also be applied to a DC/DC converter or an AC/DC converter.

The power conversion device 200 is not limited to the case where the load 300 described above is an electric motor, and for example, may be used as a power supply device of an electric discharge machine, a laser processing machine, an induction heating cooker or a contactless power supply system. Furthermore, the power conversion device 200 can also be used as a power conditioner for a solar power generation system or a storage system. Note that the technical features described in the embodiments may be combined properly and used.

REFERENCE SIGNS LIST

10, 10a, 10b, 202 semiconductor apparatus, 16 base plate, 20, 22, 24 semiconductor device, 28 mold resin, 30 lead frame, 31 first surface, 32 second surface, 36 terminal insertion hole, 38 opening portion, 40, 40a, 40b press-fit terminal, 41 first press-fit portion, 42 second press-fit portion, 44a, 44b bending portion, 60 mold, 64 cavity, 66 ceiling portion, 68 bottom surface, 69 pin, 200 power conversion device, 201 main conversion circuit, 203 control circuit

The invention claimed is:
1. A semiconductor apparatus comprising:
a conductive base plate;
a lead frame having a first surface and a second surface that is a surface opposite to the first surface, the second surface being bonded to an upper surface of the base plate;
a semiconductor device provided on the first surface of the lead frame; and
a mold resin that covers the upper surface of the base plate, the lead frame, and the semiconductor device,
wherein the mold resin is provided with a terminal insertion hole which extends from a surface of the mold resin to the lead frame and into which a press-fit terminal is inserted,
the lead frame is provided with an opening portion which intercommunicates with the terminal insertion hole and into which the press fit terminal is press-fitted such that a bottom end of the press fit terminal is below a top surface of the base plate,
an end portion of the lead frame is not exposed from a side surface of the mold resin forming an outer shell of the mold resin, and
the base plate includes an insulating layer on the lead frame side.

2. The semiconductor apparatus according to claim 1, wherein the end portion of the lead frame is covered by the mold resin.

3. The semiconductor apparatus according to claim 1, wherein the terminal insertion hole extends from a surface facing the first surface of the mold resin to the first surface, and the press-fit terminal is press-fitted into the opening portion from a side of the first surface.

4. The semiconductor apparatus according to claim 1, further comprising the press-fit terminal that is provided with a first press-fit portion having an elastic force and a second press-fit portion having an elastic force at each of both ends thereof, and is inserted in the terminal insertion hole,
wherein the first press-fit portion is press-fitted in the opening portion, and
the second press-fit portion is provided outside the mold resin.

5. The semiconductor apparatus according to claim 4, wherein the press-fit terminal has a bending portion between the first press-fit portion and the second press-fit portion,
positions of the first press-fit portion and the second press-fit portion are displaced from each other in a horizontal direction due to the bending portion, and
the bending portion is provided outside the mold resin.

6. The semiconductor apparatus according to claim 5, wherein the second press-fit portion is provided outward in the horizontal direction with respect to the first press-fit portion.

7. The semiconductor apparatus according to claim 5, wherein the second press-fit portion is provided inward in the horizontal direction with respect to the first press-fit portion.

8. The semiconductor apparatus according to claim 1, wherein the semiconductor device is made with a wide bandgap semiconductor.

9. The semiconductor apparatus according to claim 8, wherein the wide bandgap semiconductor is silicon carbide, a gallium-nitride-based material or diamond.

10. A power conversion device comprising:
a main conversion circuit that includes the semiconductor apparatus according to claim 1, converts input power and outputs the converted input power; and
a control circuit that outputs a control signal for controlling the main conversion circuit to the main conversion circuit.

11. A semiconductor apparatus comprising:
a conductive base plate;

a lead frame having a first surface and a second surface that is a surface opposite to the first surface, the second surface being bonded to an upper surface of the base plate;

a semiconductor device provided on the first surface of the lead frame; and a mold resin that covers the upper surface of the base plate, the lead frame, and the semiconductor device, wherein the mold resin is provided with a terminal insertion hole which extends from a surface of the mold resin past the lead frame to a depth below a top surface of the base plate and the semiconductor device, and into which a press-fit terminal is inserted the lead frame is provided with an opening portion which intercommunicates with the terminal insertion hole and into which the press fit terminal is press-fitted, and the base plate includes an insulating layer on the lead frame side.

12. The semiconductor apparatus according to claim 11, wherein an end portion of the lead frame is covered by the mold resin.

13. The semiconductor apparatus according to claim 11, wherein the terminal insertion hole extends from a surface facing the first surface of the mold resin to the first surface, and the press-fit terminal is press-fitted into the opening portion from a side of the first surface.

14. The semiconductor apparatus according to claim 11, further comprising the press-fit terminal that is provided with a first press-fit portion having an elastic force and a second press-fit portion having an elastic force at each of both ends thereof, and is inserted in the terminal insertion hole, wherein the first press-fit portion is press-fitted in the opening portion, and the second press-fit portion is provided outside the mold resin.

15. The semiconductor apparatus according to claim 14, wherein the press-fit terminal has a bending portion between the first press-fit portion and the second press-fit portion, positions of the first press-fit portion and the second press-fit portion are displaced from each other in a horizontal direction due to the bending portion, and the bending portion is provided outside the mold resin.

16. The semiconductor apparatus according to claim 15, wherein the second press-fit portion is provided outward in the horizontal direction with respect to the first press-fit portion.

17. The semiconductor apparatus according to claim 15, wherein the second press-fit portion is provided inward in the horizontal direction with respect to the first press-fit portion.

18. The semiconductor apparatus according to claim 11, wherein the semiconductor device is made with a wide bandgap semiconductor.

19. The semiconductor apparatus according to claim 18, wherein the wide bandgap semiconductor is silicon carbide, a gallium-nitride-based material or diamond.

20. A power conversion device comprising:

a main conversion circuit that includes the semiconductor apparatus according to claim 11, converts input power and outputs the converted input power; and a control circuit that outputs a control signal for controlling the main conversion circuit to the main conversion circuit.

* * * * *